United States Patent [19]

Sawairi et al.

[11] 4,164,778
[45] Aug. 14, 1979

[54] PRINTED CIRCUIT BOARD

[75] Inventors: Hitoshi Sawairi; Fuminori Hirose; Kaoru Konishikawa, all of Hirakata, Japan

[73] Assignee: Matsushita Electric Industrial Co., Ltd., Osaka, Japan

[21] Appl. No.: 816,197

[22] Filed: Jul. 15, 1977

[30] Foreign Application Priority Data

Jul. 20, 1976 [JP] Japan .............................. 51-97150[U]
Jul. 20, 1976 [JP] Japan .............................. 51-97151[U]
Jul. 20, 1976 [JP] Japan .............................. 51-97152[U]

[51] Int. Cl.² ............................................ H05K 5/00
[52] U.S. Cl. ................................ 361/409; 361/406; 361/411
[58] Field of Search ............... 361/404, 405, 411, 400, 361/406, 310, 309, 306; 338/329, 306-308; 174/68.5

[56] References Cited

U.S. PATENT DOCUMENTS

| | | | |
|---|---|---|---|
| 3,429,040 | 2/1969 | Miller | 361/411 |
| 3,517,279 | 6/1970 | Ikeda et al. | 357/68 |
| 3,610,811 | 10/1971 | O'Keefe | 361/411 |
| 3,778,532 | 12/1973 | Braden | 361/405 |
| 3,967,296 | 6/1976 | Intrator | 361/405 |

Primary Examiner—David Smith, Jr.
Attorney, Agent, or Firm—Wenderoth, Lind & Ponack

[57] ABSTRACT

A printed circuit board which is an electrically insulative substrate of synthetic resin having at least one pair of spaced electroconductive layers. An electric and/or electronic component, such as resistor or capacitor, of a type which has no lead wires extending outwardly therefrom for external electric connection, but which is constituted by a substantially cubic body having its opposed area applied with respective films or foils of electroconductive material which serve as terminal electrodes, is mounted on the substrate with the terminal electrodes soldered to the respective electroconductive layers. To this end, each of the electroconductive layers has a round portion for connection with the associated terminal electrode of the component. Each round portion has an effective surface area equal to or smaller than any of the terminal electrodes.

14 Claims, 21 Drawing Figures

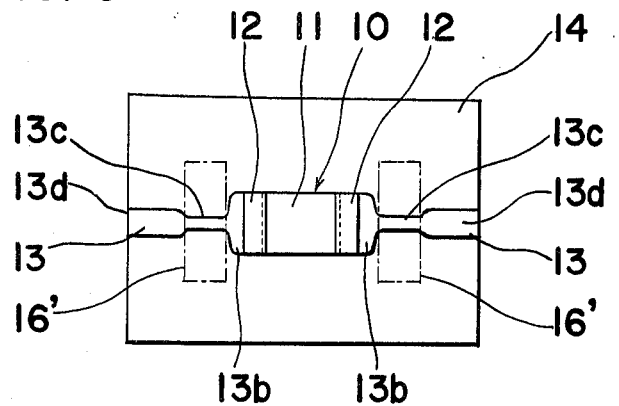
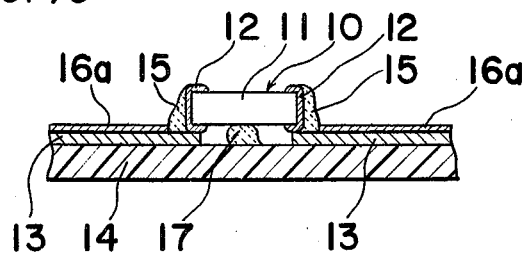
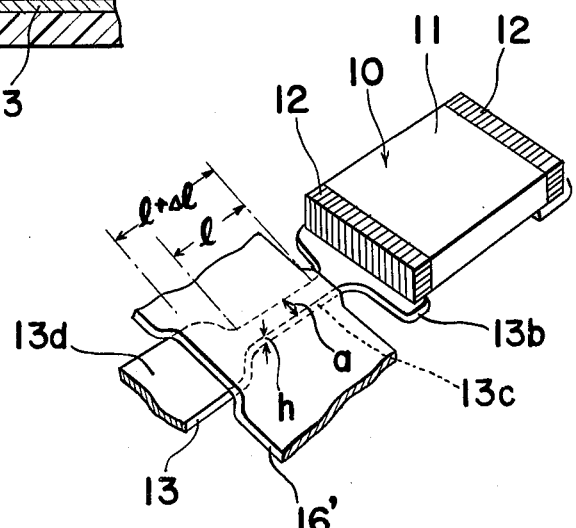
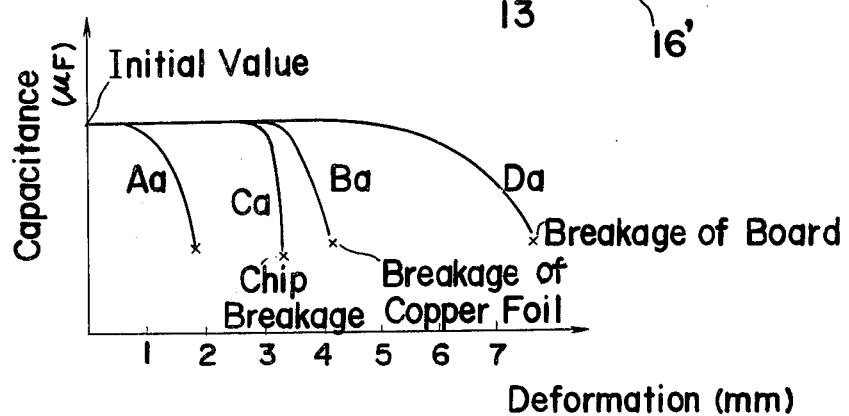

PRINTED CIRCUIT BOARD

The present invention generally relates to a printed circuit board and, more particularly, to a printed circuit board made of an electrically insulation board prepared from a paper-based laminated sheet of synthetic resin such as phenol or epoxy resin which has a plurality of electric and/or electronic wireless components mounted thereon in an electrically connected relation to electroconductive layers on at least one surface of the printed circuit board.

It is to be noted that the term "electric and/or electronic wireless component" or, simply, "wireless component" hereinabove and hereinafter referred to is, as shown in FIG. 1 of the accompanying drawings, intended to mean an electric component, such as resistor or capacitor, of a type which has no lead wires extending outwardly therefrom for external electric connection, but which is constituted by a substantially cubic body 11 having its opposed areas applied with respective films or foils of electroconductive material which serve as terminal electrodes 12. More specifically, when the wireless component is a resistor, the wireless component is constituted by a substantially cubic body of ceramic material which is its surface applied with a film of resistance material and has its opposed area applied with separate terminal electrodes, and when the wireless component is a capacitor, the wireless component is constituted by a substantially cubic body of dielectric material, such as barium titanate and has its opposed ends formed with terminal electrodes which are made of films or foils of electroconductive material such as silver or palladium.

Mounting of the wireless component on the printed circuit board with its terminal electrodes electrically connected to respective electroconductive layers which are formed on at least one surface of the printed circuit board has heretofore been carried out in the manner which will now be described with particular reference to FIGS. 2 and 3. As best shown in FIG. 2, for the purpose of electrically connecting of the electroconductive layers 13 on the printed circuit board 14 with the respective terminal electrodes 12 of the wireless component 10, each of the electroconductive layers 13 is provided with a round portion 13a of a size two to three times larger than the size of the associated terminal electrode of the wireless component 10. The wireless component 10 is placed on the printed circuit board 14 with its terminal electrodes 12 held in contact with the respective round portions 13a of the electroconductive layers 13; each of the areas where the terminal electrodes 12 contacts the associated round portions 13a is soldered to provide, as shown in FIG. 3, a solder bead 15 through which the corresponding terminal electrode 12 is electrically and firmly connected to the associated round portion 13a of the electroconductive layer 13 on the printed circuit board 14.

According to the above described conventional method of mounting the wireless component onto the printed circuit board, where the printed circuit board 14 is made of an electrically insulation board prepared from a paper-based laminated sheet of synthetic resin such as phenol or epoxy resin and which is flexible, the printed circuit board tends to deform upon receipt of an external load applied thereto. Bending stresses consequently develop in the printed circuit board 14. In view of this, when the printed circuit board 14 is so deformed, the wireless component 10 so mounted on the printed circuit board 14 with its terminal electrodes 12 soldered to the electroconductive layers 13 through the solder beads 15 is susceptible to cracking, or otherwise breaking, upon application of the external load.

SUMMARY OF THE INVENTION

Accordingly, the present invention has been made with a view toward substantially eliminating the above described disadvantages and inconveniences inherent in the conventional mounting of the wireless component on the printed circuit board.

According to the present invention, to connect the terminal electrodes of the wireless component to the electroconductive layers on the printed circuit board by means of soldering, the effective surface area of each of the round portions of the respective electroconductive layers is so rendered to be equal to or slightly smaller than the surface area of the associated terminal electrode of the wireless component so that the amount of solder deposited, that is, the size of the solder bead formed for connecting the terminal electrodes of the wireless component to the associated electroconductive layer on the printed circuit board, can advantageously be controlled to such an extent that, even if the printed circuit board is deformed by the application of the external load thereto, the wireless component so mounted will not be adversely affected or damaged.

BRIEF DESCRIPTION OF THE DRAWINGS

These and other objects and features of the present invention will become apparent from the following description taken in conjunction with preferred embodiments thereof with reference to the accompanying drawings, in which:

FIG. 9 and 10 are views respectively similar to FIGS. 2 and 3, showing a third preferred embodiment of the present invention;

FIG. 11 is a perspective view of a portion of the printed circuit board shown in FIG. 9, the portion being shown on an enlarged scale;

FIG. 12 is a graph illustrating the results of a test in which the printed circuit board shown in FIGS. 9 to 11 was compared with the prior art printed circuit board;

DETAILED DESCRIPTION OF THE INVENTION

Figure 1:
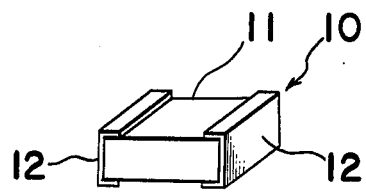
FIG. 1 is a schematic perspective view of a wireless component.

Before the description of the present invention proceeds, it is to be noted that like parts are designated by like reference numerals throughout the accompanying drawings.

Figure 4:
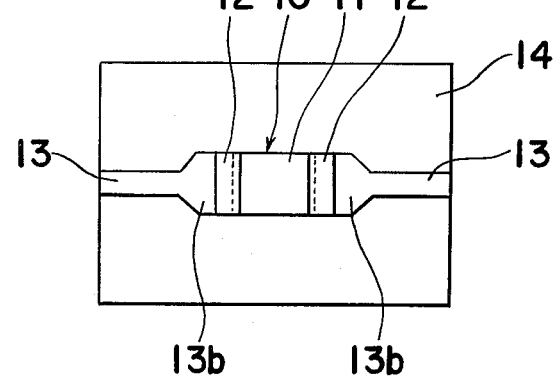
FIGS. 4 and 5 are views respectively similar to FIGS. 2 and 3, showing a first preferred embodiment of the present invention.
Figure 5:
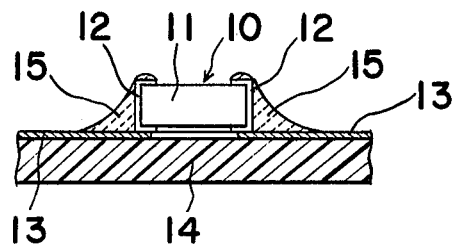

Referring to FIGS. 4 and 5, a printed circuit board 14, which is comprised of an electrically insulation board prepared from a paper-based laminated sheet of synthetic resin such as phenol or epoxy resin, is shown to have electroconductive layers 13 formed on one surface of the printed circuit board 14. A wireless component 10 is mounted on the printed circuit board 14 in a manner as will be described later.

The wireless component 10 is comprised of a substantially rectangular cubic body 11 of dielectric material having its opposed ends formed with respective terminal electrodes 12 which are formed by applying, or otherwise depositing, films of an electroconductive material such as silver or palladium. This wireless component 10 is placed on the printed circuit board 14 with the terminal electrodes 12 held in electrical contact with the respective round portions 13b of the electroconductive layers 13, each of the areas of contact of the terminal electrodes 12 to the round portions 13b of the respective electroconductive layers 13 being soldered to provide a solder bead 15. Each of the rounded portions 13b in the instance as shown in FIGS. 4 and 5 has a width and a surface area substantially equal to one of the terminal electrodes 12 of the wireless component 10.

With the printed circuit board constructed as hereinabove described, the soldering strength of the terminal electrodes 12 of the wireless component 10 relative to the associated round portions 13b of the electroconductive layers 13 is lower than the allowance of strength of the wireless component 10 relative to the amount of the external load.

Figure 6:
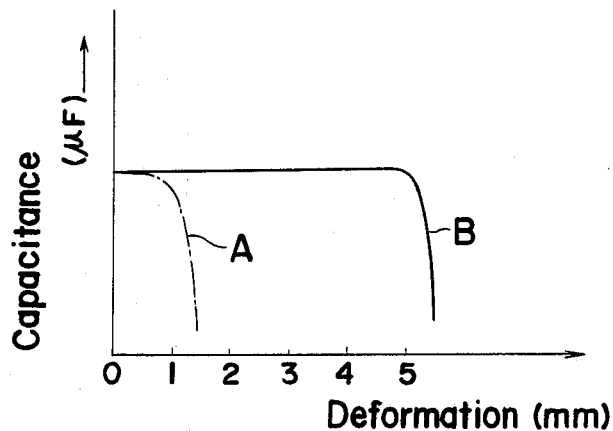
FIG. 6 is a graph illustrating the result of test in which the printed circuit board shown in FIGS. 4 and 5 was compared with the prior art printed circuit board.

Accordingly, whereas the wireless component soldered on the printed circuit board according to the prior art method tends to break when the printed circuit board is deformed about 1 mm. as shown by the curve A in the graph of FIG. 6, there is no possibility of breakage of the wireless component soldered on the printed circuit board according to the present invention, as shown by the curve B in the graph of FIG. 6, even if the printed circuit board is deformed about 5 mm. by the application of the external load thereto. Moreover, the possibility of breaking the wireless component can be minimized, according to the present invention, by the utilization of the elasticity of soldered portions thereof.

The fact that the size of each of the round portions 13b of the respective electroconductive layers 13, to which the terminal electrodes of the wireless component are respectively soldered, is made substantially equal to the size of the associated terminal electrode 12 of the wireless component and the solder strength is reduced according to the present invention means that the amount of solder subsequently deposited can be reduced and that the resultant solder bead is capable of being elongated prior to the wireless component being broken eliminates or minimizes the possibility of breakage of the wireless component that may occur upon deformation of the printed circuit board.

In order to obtain the characteristics shown in FIG. 6, variation of the capacitance of the wireless component (which was a capacitor having a rectangular cubic body of dielectric material with its opposed ends formed with respective terminal electrodes which were not made of silver or palladium) was tested while the printed circuit board, wherein the electrically insulating board was made of a paper-based laminated sheet of epoxy resin and on which the above described capacitor was soldered, was supported at two points spaced 90 mm. apart and the external load was applied thereto.

Although in the foregoing embodiment shown in FIGS. 4 and 5 each of the round portions 13b of the electroconductive layers 13 on the printed circuit board 14 has been described as having a size substantially equal to the size of any one of the terminal electrodes 12 of the wireless component 10, the former may be smaller than the latter should a satisfactory electric connection be established between the terminal electrodes of the wireless components and the respective round portions of the electroconductive layers on the printed circuit board. In this case, a mechanical connection of the wireless component 10 to the printed circuit board 14 can or may be effected by the use of a suitable bonding agent, preferably, a bonding agent of a type having a thermosetting resin as its principal constituent.

Figure 2:
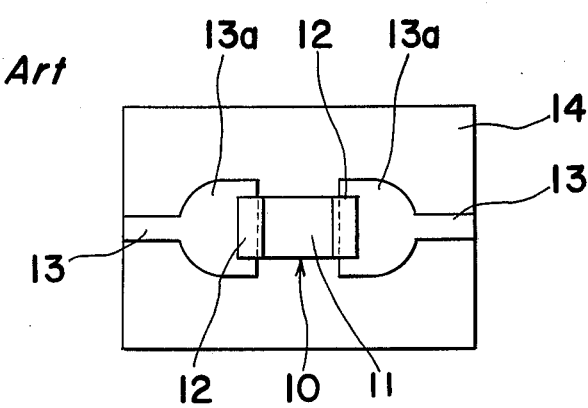
FIG. 2 is a schematic top plan view of a printed circuit board on which the wireless component is mounted according to the prior art mounting method.
Figure 3:
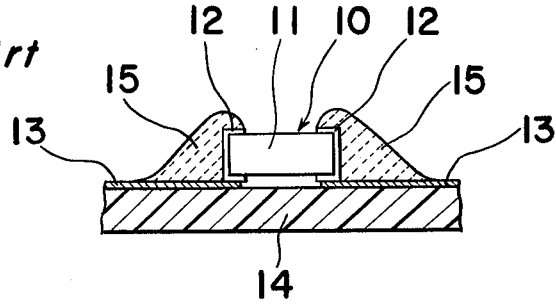
FIG. 3 is a cross-sectional view of the printed circuit board shown in FIG. 2.

Furthermore, in the foregoing embodiment of FIGS. 4 and 5, it has been described that each of the round portions 13b of the electroconductive layers 13 has a size substantially equal to or smaller than that of any one of the terminal electrodes 12 of the wireless component. However, if each of the round portions of the electroconductive layers 13 has a size which is larger than any one of the terminal electrodes of the wireless component such as shown in FIGS. 2 and 3, the object of the present invention can equally be achieved. This will now be described with reference to FIGS. 7 and 8.

Figure 7:
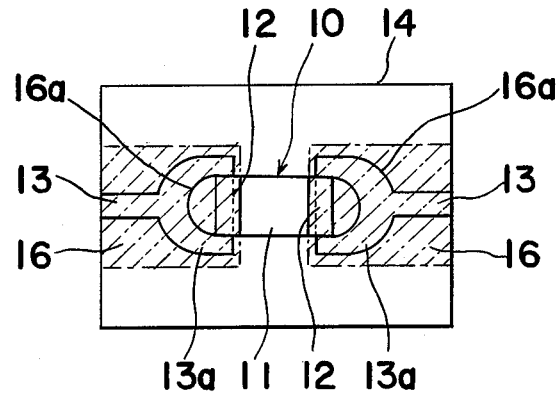
FIGS. 7 and 8 are views respectively similar to FIGS. 2 and 3, showing a second preferred embodiment of the present invention.
Figure 8:
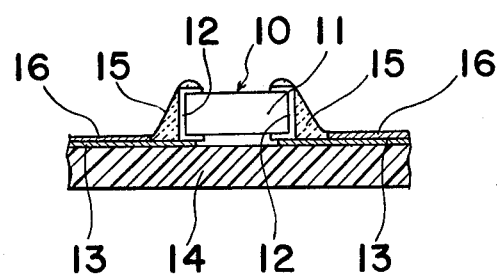

Referring now to FIGS. 7 and 8, a solder resist layer 16 is employed for each round portion 13a of the electroconductive layers 13. The resist layer 16 has an opening 16a defined therein of a size substantially equal to or smaller than the size of the terminal electrode 12 and is applied to the printed circuit board 14 while an area of the round portion 13a, to which the corresponding terminal electrode 12 is to be soldered, is exposed to the outside through the opening 16a in the resist layer 16. Therefore, it is clear that the solder bead 15, which electrically connects the terminal electrode 12 to the round portion 13a of the electroconductive layer 13, is deposited on the area of the round portion 13a which is left open by the opening 16a of the resist layer 16 for receiving such a solder bead 15.

In the embodiment shown in FIGS. 9 to 11, there are illustrated electroconductive layers 13 each having a constricted area 13c of a width smaller than that of the remaining portion of the electroconductive layer 13. This constricted area 13c is positioned between the round portion 13a and a jumper portion 13d. Each of the constricted area 13c of the electroconductive layers 13 is, as best shown in FIGS. 9 and 11, covered by a solder resist layer 16'.

In the arrangement shown in FIGS. 9 to 11, the disruptive strength of each of the constricted areas 13c of the respective electroconductive layers 13 on the printed circuit board 14 can be rendered to be lower than the allowance of strength of the wireless component 10, soldered on the printed circuit board 14, relative to the amount of the external load.

Accordingly, whereas the wireless component soldered on the printed circuit board according to the prior art method tends to break when the printed circuit board is deformed about 1 mm. as shown by the curve Aa in the graph of FIG. 12, there is no possibility of breakage of the wireless component soldered on the printed circuit board according to the present invention, as shown by the curve Ba in the graph of FIG. 12, even if the printed circuit board is deformed about 3 mm. by the application of the external load thereto. Moreover, the possibility of breakage of the wireless component can, according to the present invention, be minimized by the utilization of the constricted areas 13c of the respective electroconductive layers. In other words, the provision of the constricted areas 13c between the rounded portion 13a and the jumper portion 13d of the electroconductive layer 13 is advantageous in that the constricted area 13c is, when the printed circuit board 14 is deformed, elongated a distance shown by Δl in FIG. 11, thereby minimizing the possibility of breaking the wireless component.

In order to obtain the characteristics shown in FIG. 12, variation of the capacitance of the wireless component, which was a capacitor having a rectangular cubic body of dielectric material with its opposed ends formed with respective terminal electrodes which were made of silver and palladium, was tested while the printed circuit board, wherein the electrically insulation board was made of a paper-based laminated sheet of epoxy resin and on which the above described capacitor was soldered at a central portion of the printed circuit board, was supported at two points spaced 90 mm. apart and the external load was applied thereto.

In the graph of FIG. 12, the capacitance variation shown by the curve Aa was exhibited by the wireless component, that is, the capacitor, soldered onto the printed circuit board according to the prior art wherein the width and the thickness of each of the electroconductive layers other than the round portion are 1,000 μm and 30 μ, m respectively. The capacitance variation shown by the curve Ba was exhibited by the wireless component soldered on the printed circuit board wherein the width and the thickness of each of the constricted areas of the respective electroconductive layers are 200 μm and 30 μ, m respectively. The capacitance variation shown by the curve Ca was exhibited by the wireless component solered on the printed circuit board wherein the width and the thickness of each of the constricted areas of the respective electroconductive layers are 700 μm and 30 μ, m respectively. The capacitance variation shown by the curve Da was exhibited by the wireless component soldered on the printed circuit board wherein the width of each of the electroconductive layers are 500 μm.

As can be understood from the graph of FIG. 12, if the cross-sectional area of each of the constricted areas 13c of the respective electroconductive layers 13 is not more than 0.02 mm², a satisfactory result can be appreciated. In this test, the wireless components employed were dimensioned 1.5-2 mm. × 3.5-4 mm. × 0.5-1 mm.

It is to be noted that, if any one of the constricted areas 13c of the electroconductive layers 13 is positioned far apart from the adjacent round portion 13b, no advantage will be appreciated. Therefore, any one of the constricted areas 13c is preferably positioned a predetermined distance, for example, 3 to 4 mm., apart from the adjacent round portion 13b, the length thereof being preferably within the range of 1 to 2 mm. so that the elongation of the printed circuit board can be absorbed.

In the embodiment shown in FIGS. 9 to 11, the wireless component 10 is mechanically connected to the printed circuit board 14 by means of a deposit 17 of bonding agent between the round portions 13b. However, this may not always be necessary.

Figure 13:
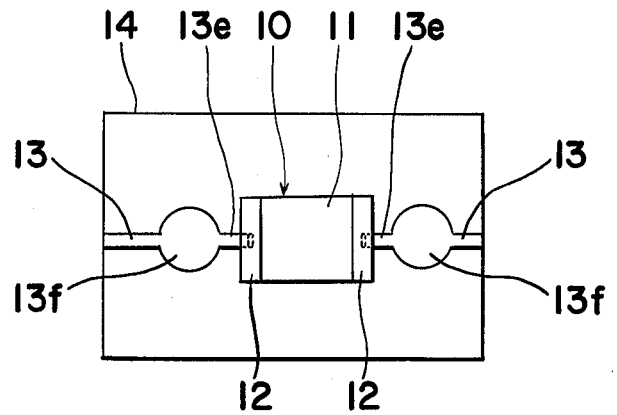
FIGS. 13 and 14 are views respectively similar to FIGS. 2 and 3, showing a fourth preferred embodiment of the present invention.
Figure 14:
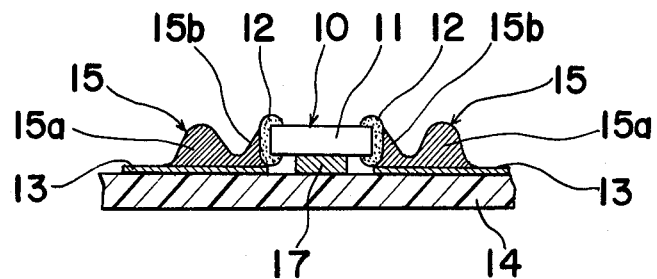

In the embodiment shown in FIGS. 13 and 14, each of the electroconductive layers 13 is shown to have an enlarged area 13f defined at a substantially intermediate portion thereof, the round portion 13e being smaller in size than the size of the terminal electrode 12 of the wireless component 10. The enlarged areas 13f of the respective electroconductive layers 13 are of a substantially circular shape and serve as support bases for the support of major portions of the associated beads 15 which are subsequently deposited upon soldering of the terminal electrodes 12 to the round portions 13e of the electroconductive layers 13.

In the arrangement show in FIG. 13, when the soldering is effected to connect the terminal electrodes 12 of the wireless component 10 to the round portions 13e of the electroconductive layers 13, each of the solder deposits, which are ultimately formed into the solder beads 15 shown in FIG. 14, is, while in a molten state, attracted towards the adjacent enlarged area 13 by the effect of its own suface tension so that a major portion 15a of the solder bead 15 is formed on the enlarged area 13f while the remaining portion 15b of the same solder bead 15, which is integral with the major portion 15a, but is smaller in size than the size of the major portion 15a, is formed on the round portion 13e. Because of this, the solder strength of the terminal electrodes 12 of the wireless component 10 soldered to the respective round portions 13e can be rendered to be lower than the allowance of strength of the wireless component 10 relative to the amount of the external load applied thereto.

Figure 15:
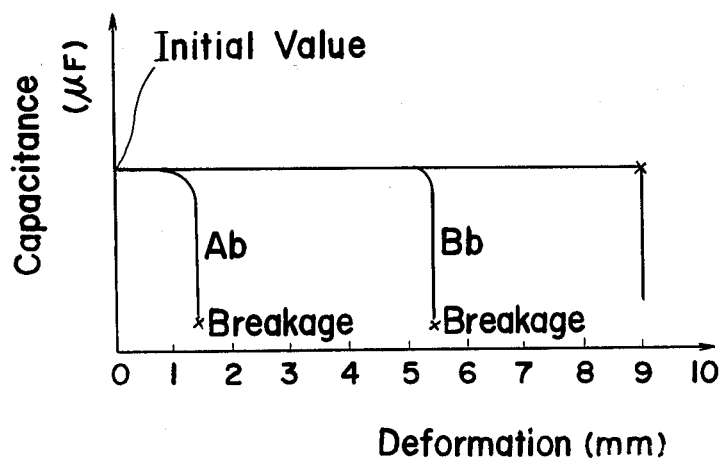
FIG. 15 is a graph illustrating the results of a test in which the printed circuit board shown in FIGS. 13 and 14 was compared with the prior art printed circuit board.

Accordingly, whereas the wireless component soldered on the printed circuit board according to the prior art method tends to break when the printed circuit board is deformed about 1 mm. as shown by the curve Ab in the graph of FIG. 15, there is no possibility of breakage of the wireless component soldered on the printed circuit board according to the present invention as shown by the curve Bb in the graph of FIG. 15, even if the printed circuit board is deformed and, moreover, the possibility of breakage of the wireless component can, according to the present invention, be minimized by the utilization of the elasticity of the soldered portions thereof. In other words, by effecting the soldering in such a manner that the strength of the soldered portions between the terminal electrodes 12 and the elongated round portions 13e can be lower than the allowance of strength of the wireless component 10, stresses developed in the printed circuit board incident to deformation of the latter can be relieved by the elastic elongation of the soldered portions prior to the wireless component being broken, thereby minimizing the possibility of breakage of the wireless component. Furthermore, if the soldering is effected in the manner described above, the wireless component 10 can retain its strength until the time the printed circuit board 14 is broken, for example, as deformed about 9 mm. Therefore, it is clear that the printed circuit board with the wireless component thereon according to the present invention can advantageously withstand any external load which may be applied thereto during the installation thereof in into a cabinet, insertion thereof into a storage container or test in which aloud is applied by a loading pin.

In order to obtain the characteristics shown in FIG. 15, variation of the capacitance of the wireless component, which was a capacitor which has a square cubic body of dielectric material and has its opposed ends formed with terminal electrodes of silver and palladium, was tested while the printed circuit board, wherein the electrically insulating board was made of a paper-based laminated sheet of epoxy resin and on which the above described capacitor was soldered at a substantially central portion thereof, was supported at two points spaced 90 mm. apart and the external load was applied thereto.

Figure 16:
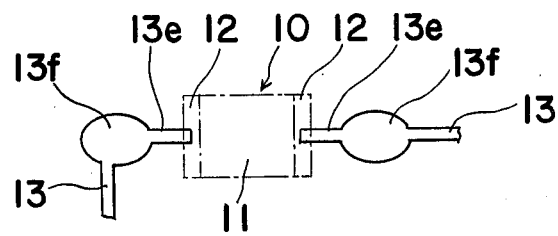
FIGS. 16 to 19 are diagrams showing various types of electroconductive layers which may be employed in the present invention.
Figure 17:
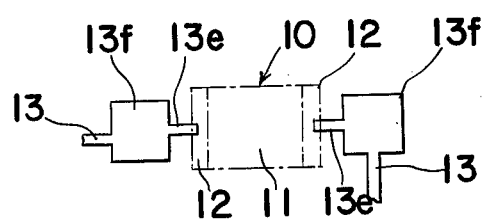
Figure 18:
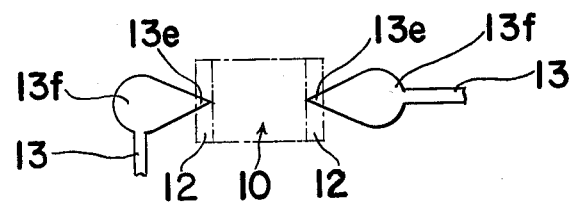
Figure 19:
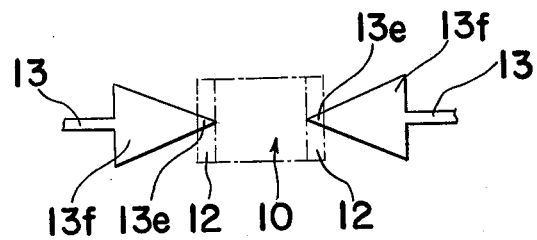

In the embodiment shown in FIGS. 14 and 15, it has been described that each of the enlarged areas 13f is of a substantially circular shape. However, each of the enlarged areas 13f may be of a substantially elliptic shape as shown in FIG. 16 or of a substantially square shape as shown in FIG. 17. Alternatively, each of the electroconductive layers 13 may be designed so that the round portion 13e and the enlarged area 13f form a substantially tear-drop shape as shown in FIG. 18 or a triangular shape as shown in FIG. 19.

Figure 20:
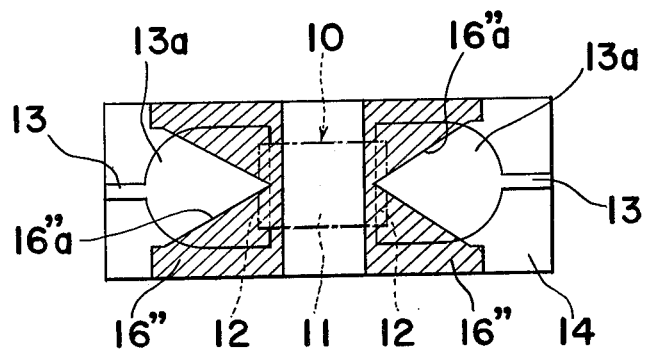
FIGS. 20 and 21 are views respectively similar to FIGS. 2 and 3, showing a further preferred embodiment of the present invention.
Figure 21:
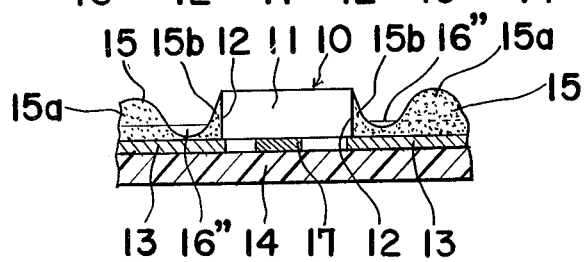

In the embodiment shown in FIGS. 20 and 21, instead of the employment of the solder resist layers 16 each having the opening 16a of substantially semi-circular shape as shown in FIG. 7, there is shown solder resist layers 16" each having a substantially V-shaped cutout 16"a. The solder resist layers 16" are respectively applied or placed on the round portions 13a of the electroconductive layers 13 in such a manner that an acutely angled portion of each of the V-shaped cutouts 16"a, which corresponds in position to the bottom of the shape of a figure "V," is positioned adjacent the associated terminal electrode 12 of the wireless component 10. It is clear that, when solder is deposited, thhe resultant beads 15 are formed in a manner as shown in FIG. 21 and in a manner substantially similar to that in the embodiment of FIGS. 13 and 14. The printed circuit board with the wireless component thereon as shown in FIGS. 20 and 21 can exhibit its characteristic similar to that shown in FIGS. 13 and 14.

Although the present invention has fully been described in connection with the various preferred embodiments thereof with reference to the accompanying drawings, it is to be noted that various changes and modifications are apparent to those skilled in the art. Therefore, such changes and modifications are to be construed as included within the true scope of the present invention unless they depart therefrom.

What is claimed is:

1. A printed circuit board comprising:
    an electrically insulative substrate of synthetic resin;
    at least one pair of spaced electroconductive layers on said insultive substrate;
    a wireless component bridging said spaced electroconductive layers, said component having at least one pair of spaced terminal electrodes, one terminal on each end of said component and each of said terminal electrodes being in contact with and soldered to one of said electroconductive layers; and
    each of said electroconductive layers having a substantially rounded portion at the portion thereof soldered to said terminal electrodes, said rounded portion having a width and a surface area no larger than the surface area and width of said terminal electrode to which it is soldered.

2. A printed circuit board as claimed in claim 1, wherein said electroconductive layers have an elongated constricted portion of reduced width extending away from said rounded portion.

3. A printed circuit board as claimed in claim 2, further comprising a solder resist layer covering said constricted portion.

4. A printed circuit board as claimed in claim 2, wherein said wireless component is mechanically connected to said insulative substrate.

5. A printed circuit board as claimed in claim 1, wherein said electroconductive layers have an enlarged portion connected to said rounded portion, said enlarged portion being larger in size than said round portion.

6. A printed circuit board as claimed in claim 5, wherein said enlarged portion is substantially circular in shape.

7. A printed circuit board as claimed in claim 5, wherein said enlarged portion is substantially square in shape.

8. A printed circuit board as claimed in claim 5, wherein said enlarged portion is substantially elliptical in shape.

9. A printed circuit board as claimed in claim 5, wherein said enlarged portion is substantially tear-drop shaped.

10. A printed circuit board is claimed in claim 5, wherein said enlarged portion is substantially triangular in shape, the triangle increasing in size in the direction away from said rounded portion.

11. A printed circuit board as claimed in claim 1, further comprising a solder resist layer over said electroconductive layers, said solder resist layer having cutout portions therein at said rounded portions of said electroconductive layer.

12. A printed circuit board as claimed in claim 11, wherein each of said cutput portions is of a width and area which is no larger than the area and width of said terminal electrode soldered to said rounded portion of said electroconductive layer.

13. A printed circuit board as claimed in claim 11, wherein said cutout portions are triangular in shape over said rounded portions, and said triangle increases in size in the direction away from said terminal electrode.

14. A printed circuit board comprising:
    an electrically insulative substrate of synthetic resin;
    at least one pair of spaced electroconductive layers on said insulative substrate;
    a wireless component bridging said spaced electroconductive layers, said component having at least one pair of spaced terminal electrodes, one terminal electrode on each end of said component and each of said terminal electrodes contacting one of said electroconductive layers;
    each of said electroconductive layers having a substantially rounded portion at the portion thereof contacting said terminal electrodes, said rounded portion having a width and a surface area no larger than the surface area and width of said terminal electrode;
    each of said electroconductive layers having an enlarger portion larger in size than said rounded portion connected to said rounded portion; and
    solder beads connecting said terminal electrodes to said electroconductive layers, said solder beads covering substantially all of the exposed surfaces of said rounded and enlarged portions.

* * * * *